(12) United States Patent
Smythe

(10) Patent No.: US 7,262,135 B2
(45) Date of Patent: Aug. 28, 2007

(54) METHODS OF FORMING LAYERS

(75) Inventor: John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,233

(22) Filed: Sep. 1, 2005

(65) Prior Publication Data

US 2007/0049003 A1    Mar. 1, 2007

(51) Int. Cl.
    *H01L 21/44*    (2006.01)
(52) U.S. Cl. .................... 438/677; 438/619; 438/688; 257/E21.489; 427/98.1
(58) Field of Classification Search ................. 438/619, 438/677, 688; 257/E21.489; 427/98.1
    See application file for complete search history.

(56) References Cited

U.S. PATENT DOCUMENTS

| 6,180,548 | B1 * | 1/2001 | Taoda et al. ................. 501/137 |
| 6,936,535 | B2 * | 8/2005 | Kim et al. ................... 438/656 |
| 7,029,831 | B2 * | 4/2006 | Minami et al. ............. 430/321 |
| 2002/0187631 | A1 * | 12/2002 | Kim et al. ................... 438/637 |
| 2005/0101132 | A1 * | 5/2005 | Kim et al. ................... 438/687 |

OTHER PUBLICATIONS

M. A. Lefcourt, G.A. Ozin, J. Phys. Chem. 1991, 95, 2616.*
M. A. Lefcourt, G. A. Ozin, J. Phys. Chem. 1991, 95, 2623.*

* cited by examiner

*Primary Examiner*—Matthew Smith
*Assistant Examiner*—Jarrett J. Stark
(74) *Attorney, Agent, or Firm*—Wells St. John P.S.

(57) ABSTRACT

The invention includes methods of forming layers conformally over undulating surface topographies associated with semiconductor substrates. The undulating surface topographies can first be exposed to one or more of titanium oxide, neodymium oxide, yttrium oxide, zirconium oxide and vanadium oxide to treat the surfaces, and can be subsequently exposed to a material that forms a layer conformally along the treated surfaces. The material can, for example, comprise an aluminum-containing compound and one or both of silane and silazane. The invention also includes semiconductor constructions having conformal layers formed over liners containing one or more of titanium oxide, yttrium oxide, zirconium oxide and vanadium oxide.

7 Claims, 5 Drawing Sheets

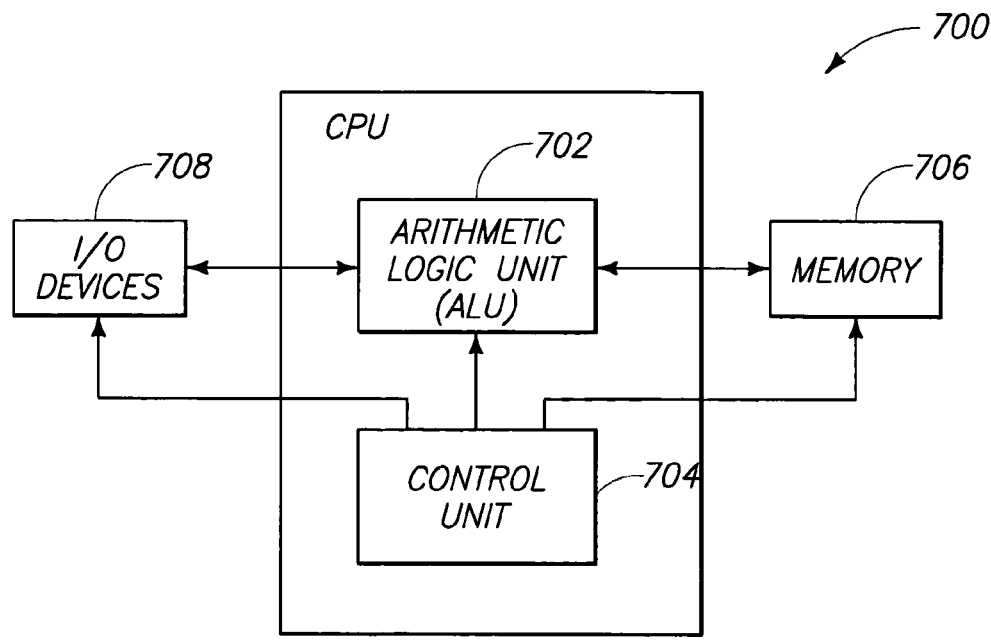
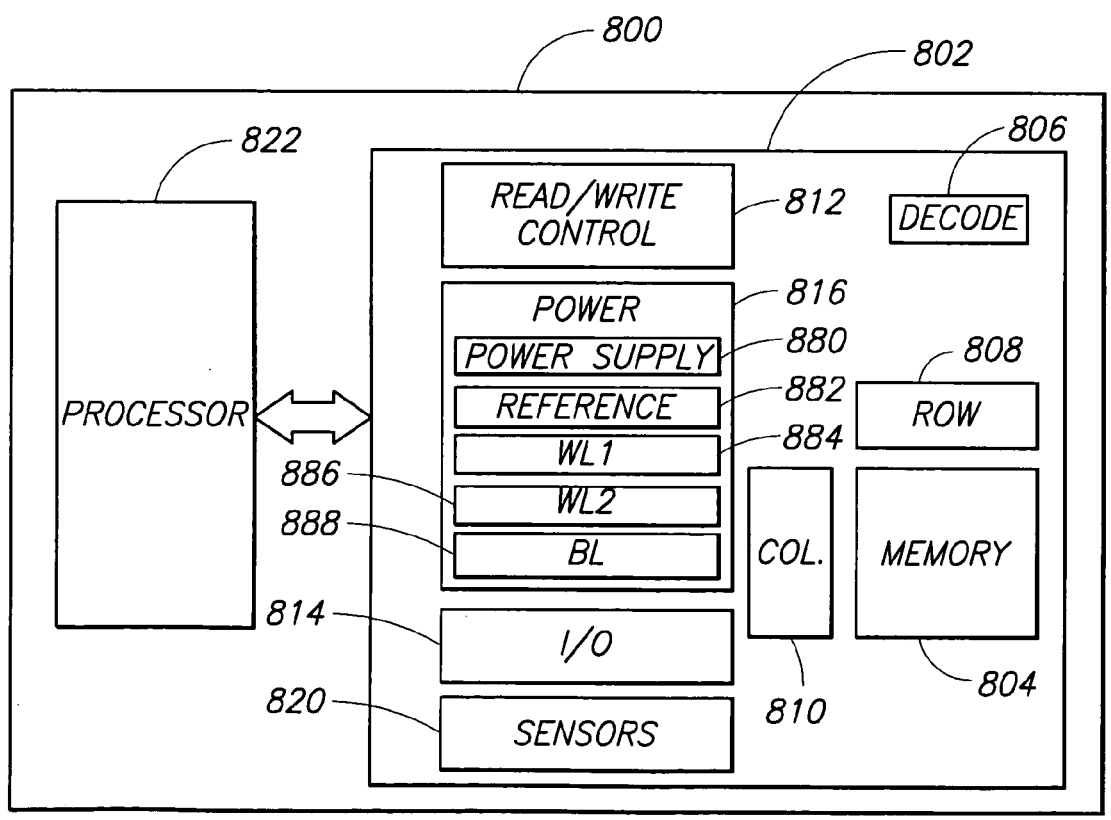

METHODS OF FORMING LAYERS

TECHNICAL FIELD

The invention pertains to semiconductor constructions, and to methods of forming layers, such as, for example, layers associated with semiconductor constructions.

BACKGROUND OF THE INVENTION

Semiconductor processing can involve fabrication of various circuit devices over a semiconductor substrate, (such as, for example, a semiconductor wafer substrate) to form integrated circuitry. Semiconductor processing frequently involves formation of thin layers or films, with such layers or films ultimately being incorporated into various integrated circuit features.

Problems can occur during the formation of layers. For instance, it can be desired for layers to be relatively conformal across an undulating topography, and yet it is found that it is very difficult in practice to form a conformal layer across a complex topography using coating type methods. Such problem is illustrated in FIG. 1 which shows a semiconductor construction 10 formed in accordance with prior art processing.

Construction 10 includes a semiconductor substrate 12. Substrate 12 can comprise, consist-essentially of, or consist of, for example, monocrystalline silicon lightly-doped with background p-type dopant. To aid in interpretation of this disclosure and the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically insulative material 14 is over substrate 12, and is patterned so that a pair of openings 16 and 18 extend through the insulative material to an upper surface of substrate 12. Opening 16 is shown to have a higher critical dimension than opening 18, or in other words is shown to have a higher ratio of height to width than opening 18.

The insulative material 14 has uppermost surfaces 15 proximate the openings 16 and 18, and has sidewall surfaces 17 forming sidewall peripheries of the openings. Substrate 12 has an upper surface 13 which forms bottom peripheries of the openings 16 and 18. The surfaces 13, 15 and 17 together define an undulating topography. A layer 20 is shown formed across such undulating topography. Layer 20 is intended to be formed conformally across the undulating topography, and a dashed line 21 diagrammatically illustrates where an upper surface of layer 20 would be if the layer were formed conformally across the undulating topography of surfaces 13, 15 and 17. However, instead of being formed conformally across the undulating topography of surfaces 13, 17 and 15, the layer 20 builds up in various locations so that the layer ends up with the upper surface 23 rather than the desired upper surface 21. More specifically, layer 20 fills the narrow opening 16, rather than forming conformally along the sidewalls 17 of such narrow opening; and forms rounded corners 25 within the wide opening 18, rather than forming the more square corners 27 associate with the idealized upper surface 21 that would result if layer 20 formed conformally within wide opening 18.

It would be desirable to develop methods for forming layers conformally over undulating topographies associate with semiconductor constructions, and to incorporate such conformal layers into integrated circuitry. Although the invention was motivated, at least in part, by a desire to form conformal layers during semiconductor processing, it is to be understood that the invention can have additional applications.

Another aspect of the prior art is that depositions have been conducted utilizing aluminum-containing materials provided over titanium-oxide-containing materials to promote adhesion to wafers having substantially non-undulating (i.e., flat or planar) surface topographies.

SUMMARY OF THE INVENTION

In one aspect, the invention includes a method of forming a layer. A material is provided which has at least one opening extending therein. A surface of the material is exposed to one or more of titanium oxide, neodymium oxide, yttrium oxide, zirconium oxide and vanadium oxide to activate said surface. The activated surface extends into the opening. The activated surface is exposed to a component, and such component is incorporated into a layer that extends conformally along the activated surface and into the opening.

In one aspect, the invention includes a method of forming an aluminum-containing layer. A semiconductor substrate is provided which has an insulative material thereover. The insulative material has an undulating outer surface that extends into one or more openings. The undulating surface of the insulative material is treated with one or more oxides selected from the group consisting of titanium oxide, neodymium oxide, yttrium oxide, zirconium oxide and vanadium oxide. The treated surface is exposed to an aluminum-containing compound and one or both of silane, and silazane to form an aluminum-containing layer that extends conformally along the treated undulating surface.

In one aspect, the invention includes a semiconductor construction. The construction comprises a semiconductor substrate having an electrically insulative material thereover. The electrically insulative material has one or more openings extending therein, and has an undulating outer surface extending into the one or more openings. A liner is along the undulating outer surface. The liner is conformal with the outer surface and comprises one or more oxides selected from the group consisting of titanium oxide, neodymium oxide, yttrium oxide, zirconium oxide and vanadium oxide. The construction further includes a layer over the liner and directly against the liner. The layer extends conformally along the liner and comprises one or more of aluminum, copper, gallium, germanium, ruthenium and silicon.

In one aspect, the invention includes an electronic system. Such system includes a semiconductor substrate and an electrical node supported by the substrate. The system also includes an electrically insulative material over the substrate and having an opening extending therethrough to the electrical node. The insulative material has an undulating outer surface that extends into the opening as a sidewall periphery of the opening. The system also includes circuitry over the insulative material, and a liner along the undulating outer surface. The liner is conformal with the outer surface and comprises one or more oxides selected from the group consisting of titanium oxide, neodymium oxide, yttrium oxide, zirconium oxide and vanadium oxide. An electrically conductive layer is over the liner and directly against the liner. The electrically conductive layer comprises one or both of aluminum and copper. The electrically conductive layer extends conformally along the liner and into the opening to conformally line the sidewall periphery of the opening and partially fill the opening. The electrically conductive material within the opening forms at least part of an electrical interconnect that electrically couples the electrical node with the circuitry that is over the insulative material.

BRIEF DESCRIPTION OF THE DRAWINGS

Preferred embodiments of the invention are described below with reference to the following accompanying drawings.

FIG. 9 is a high level block diagram of an electronic system according to an exemplary aspect of the present invention.

FIG. 10 is a simplified block diagram of an exemplary memory device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes utilization of surface modification to enable formation of conformal electrically conductive layers across semiconductor substrates. In particular aspects, a semiconductor construction having a patterned electrically insulative material is immersed in a liquid comprising one or more of titanium oxide, yttrium oxide, zirconium oxide, vanadium oxide and neodymium oxide to create a surface modification layer. The construction is then spin-coated with a metal-containing component and silane or silazane to form a metal-containing layer across the construction, and conformally across a surface of the patterned insulative material. In particular aspects, methodology of the present invention can be for utilized for pitch-doubling definition of conductive layers, and/or for fabrication of electromagnetic interference (EMI) shielding, and/or for any other applications where is advantageous to form a conformal conductive layer, or where it is desired to form a conductive layer utilizing relatively low-temperature processing.

The term "conformal" and derivations thereof (for instance, "conformally") are utilized throughout this disclosure and the claims to describe layers formed in accordance with aspects of the present invention. For purposes of interpreting this disclosure and the claims, a layer is to be understood to be "conformal" if it would be considered conformal by one of ordinary skill in the art, and can, for example, be indicated by a substantially uniform layer width down a vertical profile, and/or by a substantially uniform layer width along an interface where a substantially vertical profile joins a substantially horizontal profile. The layers utilized to define "conformal layers" are indicated to have substantially uniform widths, which can include, but is not limited to layers having perfectly uniform widths; and thus, for purposes of interpreting this disclosure and the claims that follow, so-called "conformal layers" can include, but are not limited to, layers which are perfectly conformal.

Exemplary aspects of the invention are described with reference to FIGS. 2-10.

Figure 1:
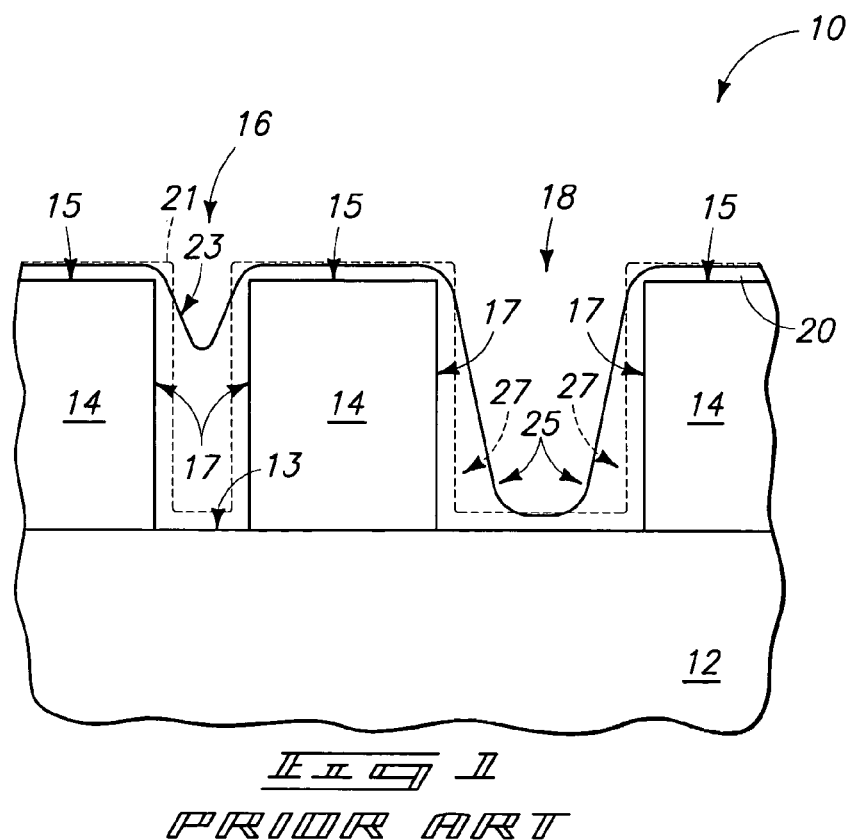
FIG. 1 is a diagrammatic, cross-sectional view of a fragment of a prior art semiconductor construction.
Figure 2:
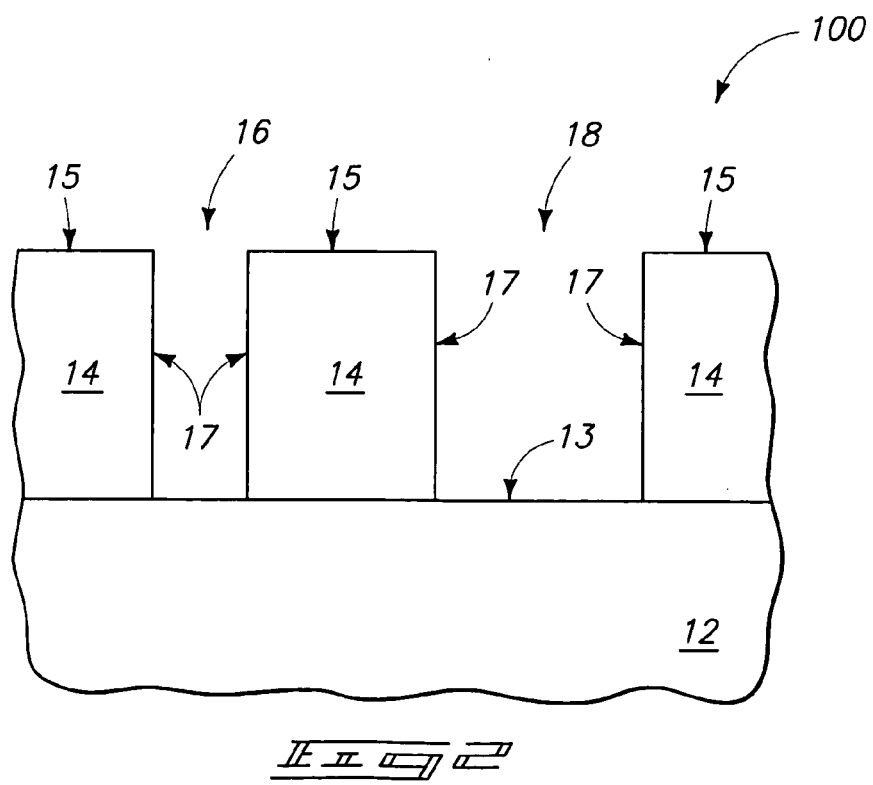
FIG. 2 is a diagrammatic, cross-sectional view of a fragment of a semiconductor construction shown at a preliminary processing stage in accordance with an exemplary aspect of the present invention.

Referring to FIG. 2, such shows a wafer construction 100 at a preliminary processing stage of an exemplary aspect of the present invention. The construction 100 comprises the substrate 12 and insulative material 14 discussed above with reference to FIG. 1. Construction 100 also comprises the openings 16 and 18 extending through insulative material 14 to substrate 12.

The substrate 12 and insulative material 14 can comprise identical compositions as discussed above with reference to FIG. 1. Accordingly, substrate 12 can correspond to a semiconductor substrate, and can, for example, comprise, consist essentially of, or consist of monocrystalline silicon. In some aspects, substrate 12 can be at a stage of integrated circuit fabrication such that some levels of integrated circuitry are therein. For instance, substrate 12 can comprise various layers of integrated circuitry (not shown) associated with a semiconductor material.

Insulative material 14 can comprise any suitable electrically insulative composition or combination of compositions, and can, for example, comprise, consist essentially of, or consist of silicon and oxygen; or can, for example, comprise, consist essentially of, or consist of silicon, oxygen and carbon.

If electrically insulative material 14 comprises silicon and oxygen, such material can comprise, consist essentially of, or consist of a doped silicon oxide (such as, for example, borophosphosilicate glass (BPSG), phosphosilicate glass (PSG), etc.), or an undoped silicon oxide (i.e., can consist of silicon dioxide).

If insulative material 14 comprises silicon, oxygen and carbon, the material can comprise, consist essentially of, or consist of so-called SiCO.

It can be preferred that insulative material 14 have a dielectric constant of less than or equal to about 4.5.

Although the shown construction has two openings (16 and 18) extending into insulative material 14, it is to be understood that the invention encompasses other aspects in which only one opening extends into a material, or in which more than two openings extend into a material. Also, although material 14 is described as being an insulative material in the shown aspect of the invention, it is to be understood that the invention also encompasses aspects in which the material having the openings extending therein is other than an electrically insulative material.

The substrate 12 has the upper surface 13 described previously with reference to FIG. 1, and material 14 has the upper surface 15 and sidewall surfaces 17 described previously with reference to FIG. 1. The surfaces 13, 15 and 17 together define an undulating topography of construction 100. Such topography includes surfaces of material 14 along the interiors of the openings 16 and 18 (i.e., includes the sidewall surfaces 17 of material 14). In some aspects, the surface of material 14 comprising the upper surface 15 and sidewall surfaces 17 can be referred to as an undulating outer surface of material 14.

Figure 3:
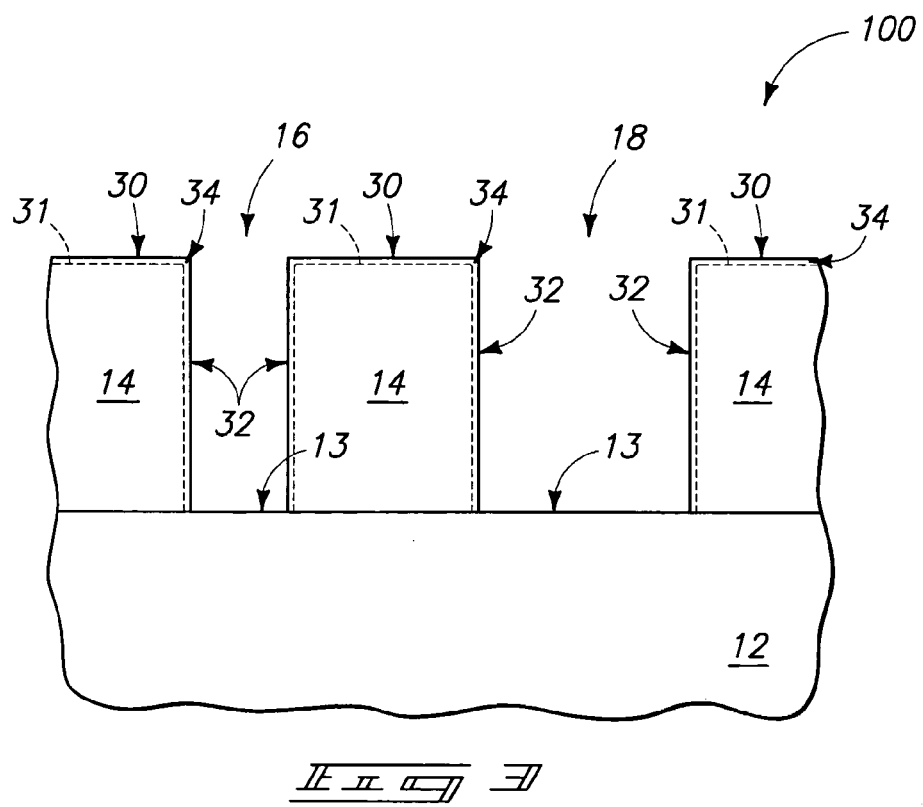
FIG. 3 is a view of the FIG. 2 cross-section shown at a processing stage subsequent to that of FIG. 2.

Referring next FIG. 3, construction 100 is illustrated after surfaces 15 and 17 (FIG. 2) have been appropriately treated to convert such surfaces to activated surfaces 30 and 32, respectively. The activation may also convert upper surface 13 of substrate 12 to an activated surface, although such is not shown in the aspect of the invention illustrated in FIG. 3. Also, in some aspects of the invention, the openings extending into material 14 will not extend entirely through the material, so that bottom peripheries of the openings comprise the material 14 instead of corresponding to a surface of substrate 12. In such aspects, activation of surfaces of material 14 will activate the surfaces along the bottom peripheries of the openings as well as the surfaces along the sidewall peripheries of the openings.

The activated surfaces can correspond to surfaces of activated regions, with the term "regions" indicating that the activated portions can have a thickness, or in other words depth. In the shown aspect of the invention, the surfaces are part of activated regions 34. Dashed lines 31 are utilized in FIG. 3 to diagrammatically illustrate a boundary between the activated regions and the material 14. Such dashed lines are not to be understood as implying an abrupt boundary between the activated regions and the material 14. Rather, it should be understood, that the transition between the activated regions and the material 14 may be a gradient in some aspects invention, or an abrupt boundary in others.

The treatment of the outer surface of material 14 can comprise, for example, exposure of such surface to treatment oxide, with such treatment oxide being one or more oxides selected from the group consisting of titanium oxide, neodymium oxide, yttrium oxide, zirconium oxide and vanadium oxide. In particular aspects, construction 10 is dipped in a liquid comprising one or more of titanium oxide, neodymium oxide, yttrium oxide, zirconium oxide and vanadium oxide to expose the surfaces of material 14 to the treatment oxide, and thereby form the activated surfaces 30 and 32.

In the shown aspect the invention, the activated region (or liner) 34 comprising treatment oxide, (i.e., comprising one or more of titanium oxide, niobium oxide, yttrium oxide, zirconium oxide and vanadium oxide) extends entirely across the undulating outer surface of material 14. The activated region can comprise the treatment oxide intercalated into the composition of material 14, or can comprise a layer of the treatment oxide over material 14. Accordingly, the activated region 34 can comprise treatment oxide mixed with the composition of material 14 in some aspects of the invention, and can consist essentially of, or consist of, treatment oxide in other aspects the invention. If, for example, the treatment oxide consists of titanium oxide and the surfaces 15 and 17 (FIG. 2) of material 14 consist of doped or undoped silicon oxide, the activated region (or liner) 34 can consist of a titanium/oxygen composition in aspects in which the treatment oxide forms a coating over the surfaces of material 14, and can comprise, consist essentially of, or consist of a titanium/silicon/oxygen composition in aspects in which the treatment oxide intercalates into the surfaces of material 14.

In an exemplary aspect, the activated surfaces 30 and 32 comprise titanium oxide. The treatment of construction 100 comprises dipping the construction in a bath comprising titanium oxide in water, with the titanium oxide being present to concentration of from about 1 weight percent to about 10 weight percent. The treatment is conducted while the bath is under a pressure of from about 80 Torr to about 500 Torr, and is at a temperature of about 30° C. to about 60° C. The treatment can be conducted for a time of from about 20 minutes to about 40 minutes. Although the exemplary treatment is described relative to utilization of titanium oxide, it is be understood that similar or identical treatments can be done with any of the treatment oxides discussed above, or with various combinations of the treatment oxides. If combinations of treatment oxides are utilized, it can be preferred that a total concentration of the treatment oxides within the treatment bath be from about 1 weight percent to about 10 weight percent.

Figure 4:
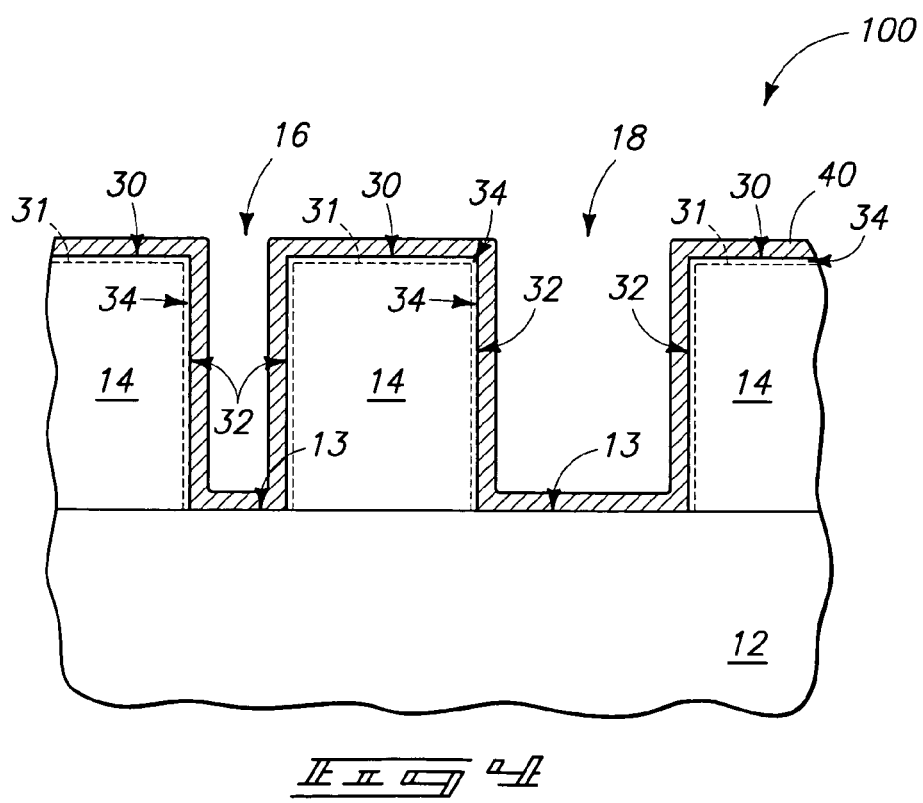
FIG. 4 is a view of the FIG. 2 cross-section shown at a processing stage subsequent to that of FIG. 3.
Figure 5:
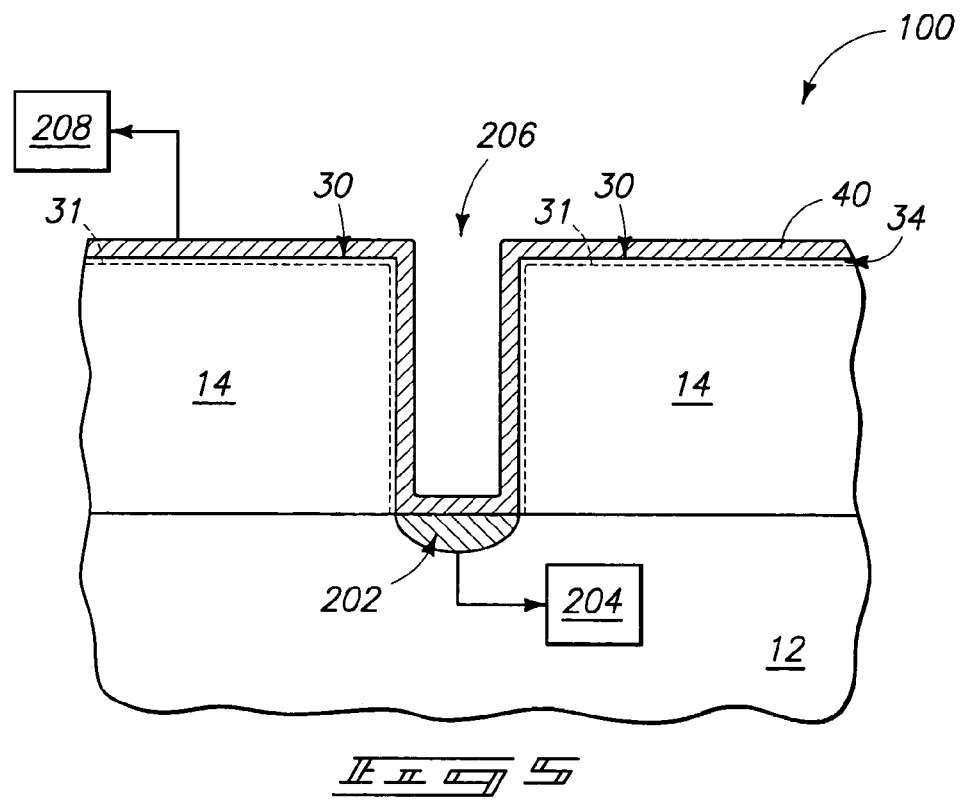
FIG. 5 is a diagrammatic, cross-sectional view of a fragment of a semiconductor construction illustrating an aspect of the present invention.

Referring to FIG. 4, a layer 40 is formed to extend conformally along activated surfaces 30 and 32, and within openings 16 and 18. Layer 40 can, for example, comprise one or more of aluminum, copper, gallium, germanium, ruthenium and silicon. Layer 40 is shown to be electrically conductive, and would typically comprise one or more of aluminum, copper and ruthenium.

Layer 40 can be formed to any suitable thickness, and would typically be formed to thickness of less than or equal to about 200 nm. In some aspects, layer 40 is formed to a width which is less than or equal to about one-third of the width of the narrowest opening. For instance, in the shown aspect of the invention opening 16 is the narrowest opening. In such aspect, layer 40 can be formed to a thickness which is less than or equal to about one-third of the width of opening 16. In particular aspects, opening 16 can have a width which is greater than equal to 150 nm, and layer 40 can be formed to a thickness of less than or equal to about 50 nm.

Layer 40 can be formed by exposing activated surfaces 30 and 32 to a solution having a desired component therein, and thereby incorporating the component into the layer 40 extending conformally along the activated surfaces 30 and 32. In exemplary aspects, the desired component is initially provided in a mixture with silane or silazane, which is then utilized to form the layer 40. For instance, if the desired component is aluminum, the layer 40 can be formed by exposing the activated surfaces 30 and 32 to a mixture containing an aluminum-containing compound and one or both of silane and silazane.

An exemplary method of forming layer 40 from aluminum-containing material corresponding to a mixture containing an aluminum-containing compound and one or both of silane and silazane is as follows. Initially, the aluminum-containing material is provided as a sol-gel metallorganic. The aluminum-containing material can be utilized neat, or can be dispersed in an appropriate solvent, such as, for example, a solvent comprising, consisting essentially of, or consisting of one or more of propylene glycol monomethyl ether acetate (PGMEA), toluene, methyl-anisole and decalin. If the aluminum-containing material is dispersed in a solvent, the concentration of the aluminum-containing material can be from about 5 weight percent to less than 100 weight percent.

The sol-gel metallorganic can be spin-coated across construction 100 to form the layer 40 conformally across activated surfaces 30 and 32. Such layer 40 can comprise, consist essentially of, or consist of aluminum; or can comprise, consist essentially of, or consist of aluminum silicide.

The sol-gel metallorganic can be at any suitable temperature during the spin-coating, and in exemplary aspects will be at a temperature of from about 100° C. to about 200° C. (typically about 150° C.).

The spin-coating is preferably conducted with the aluminum-containing material (i.e., the aluminum-containing compound and one or both of silane and silazane) being exposed only to an ambient which is inert relative to reaction with the aluminum-containing material. In other words, the spin-coating is preferably conducted under an atmosphere which is inert relative to reaction with the aluminum-containing material. Such atmosphere can, for example, consist essentially of or consist of nitrogen.

While the layer 40 is under the inert atmosphere, the layer can be subjected to an anneal. An exemplary anneal for an aluminum-containing layer comprises a temperature gradient that progresses from a first temperature of from about 140° C. to about 160° C. to a second temperature of from about 230° C. to about 260° C.; with the anneal being conducted for a time of from about 10 minutes to about 30 minutes.

Methodology similar to that discussed for formation of liner 34 and layer 40 has previously been utilized to form materials across planar surfaces. However, an aspect of the present invention is a recognition that the methodology can be utilized to form conformal layers along sidewalls of openings, and generally across undulating topographies.

The conformal layer 40 can subsequently be incorporated into integrated circuitry. For instance, the layer 40 can be utilized to conductively couple two or more integrated circuit structures to one another. Such is diagrammatically illustrated with reference to a construction 200 in FIG. 5. Construction 200 comprises several materials in common with those discussed above with reference to FIGS. 2-4, and identical numbering will be utilized in describing construction 200 as was utilized above in describing FIGS. 2-4, where appropriate.

Construction 200 comprises the substrate 12 and the insulative material 14 over the substrate. The substrate is shown having an electrical node 202 supported thereby. In the shown aspect, the node corresponds to a conductively-doped diffusion region extending within substrate 12. Such diffusion region is shown electrically coupled with a circuit structure 204. The circuit structure can be any structure utilized in integrated circuitry. For instance, diffusion region 202 can correspond to a source/drain region of a transistor device, and circuit structure 204 can be a wordline having a region corresponding to a transistor gate of the transistor device.

An opening 206 extends through material 14, and a liner 34 of the type described previously with reference to FIGS. 2-4 extends across an upper surface of material 14 and along sidewalls of material 14 corresponding to a sidewall periphery of opening 206.

A layer 40 of the type described previously with reference to FIGS. 2-4 is over and directly against the liner, and extends conformally across the top of material 14 and within the opening 206 (specifically, along the sidewall periphery of the opening 206). In particular aspects, layer 40 can be an electrically conductive layer comprising one or both of aluminum and copper.

A circuit structure 208 is shown electrically coupled with the layer 40 over material 14. In some aspects, circuit structure 204 can be referred to as a first circuit structure and circuit structure 208 can be referred to as a second circuit structure. The electric conductive layer 40 forms at least a portion of an electrical interconnect extending between the first and second circuit structures 204 and 208.

Layer 40 only partially fills opening 206. In some aspects (not shown) the remainder the opening is filled with additional material. If the additional material is a conductive material (such as, for example, tungsten) the additional material and conductive layer 40 together form an electrical interconnect that fills the opening. If the additional material is an electrically insulative material (such as, for example, silicon dioxide or silicon nitride), layer 40 will alone be an electrical interconnect extending from a bottom of opening 206 to a top of the opening.

Figure 6:
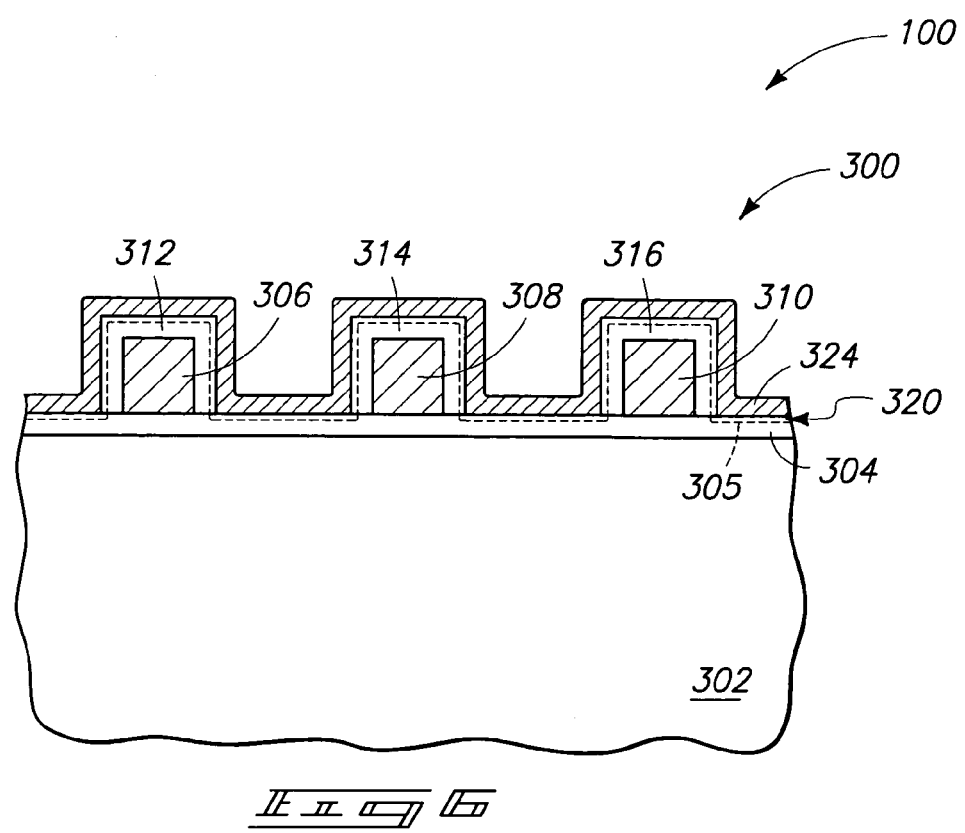
FIG. 6 is a diagrammatic, cross-sectional view of a fragment of a semiconductor construction illustrating another aspect of the present invention.

As discussed previously, a conformal layer formed in accordance with aspects of the present invention can be used for creating electromagnetic interference shielding. FIG. 6 shows a construction 300 illustrating an exemplary application for a conformal layer of the present invention as electromagnetic interference shielding.

The construction 300 includes a substrate 302 having an electrically insulative material 304 thereover. The insulative material 304 is a planar material, and a plurality of conductive lines 306, 308 and 310 are on an upper surface of material 304. The lines 306, 308 and 310 extend into and out of the plane of the cross-section of FIG. 6. Insulative shells 312, 314, and 316 surround outer surfaces of lines 306, 308 and 310, respectively. The electrically insulative compositions of material 304 and shells 312, 314 and 316 can be any suitable compositions, and can be the same as one another or different. In particular aspects, the material 304 and shells 312, 314, 316 will all consist of silicon dioxide. The lines 306, 308 and 310 can comprise any suitable composition or combination of compositions, and can correspond to any of numerous integrated circuit elements. For instance, the lines can correspond to wordlines or bitlines, or can correspond to interconnects associate with so-called metal I, a metal II, metal III, or higher layers of integrated circuitry.

An activated region (or liner) 320 extends across an undulating surface comprising regions of material 304 and shells 312, 314 and 316. A dashed line 305 is provided to indicate an approximate boundary of the activated region. The activated region 320 can be identical to the activated region 34 discussed above with reference to FIGS. 2-5, and accordingly can comprise one or more of titanium oxide, neodymium oxide, yttrium oxide, zirconium oxide and vanadium oxide, and can be formed with identical processing as discussed above relative to formation of region 34.

A layer 324 extends conformally along the activated region 320. Layer 324 can comprise compositions identical to those discussed above regarding layer 40 of FIGS. 2-5, and can be formed with identical processing as discussed above relative to formation of layer 40. Layer 324 can thus be an electrically conductive layer containing aluminum. Such layer advantageously wraps conformally around outer surfaces of lines 306, 308 and 310, which can be of significant benefit when utilizing the layer 320 for electromagnetic interference shielding.

Various layers and structures of the present invention can be incorporated into electronic systems, such as, for example, computer systems.

Figure 7:
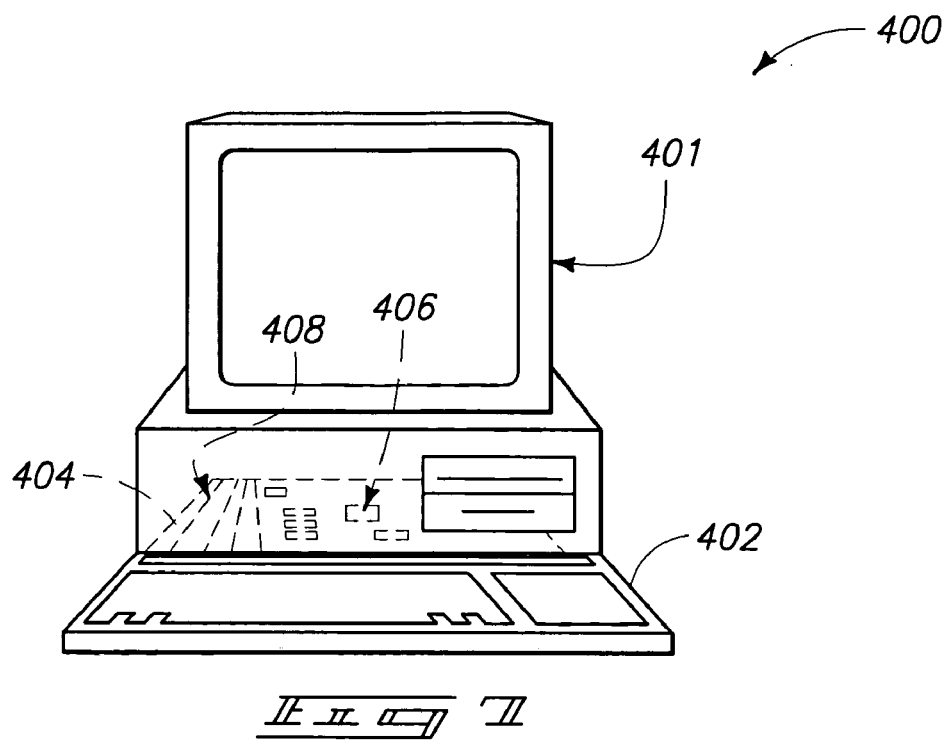
FIG. 7 is a diagrammatic view of a computer illustrating an exemplary application of the present invention.
Figure 8:
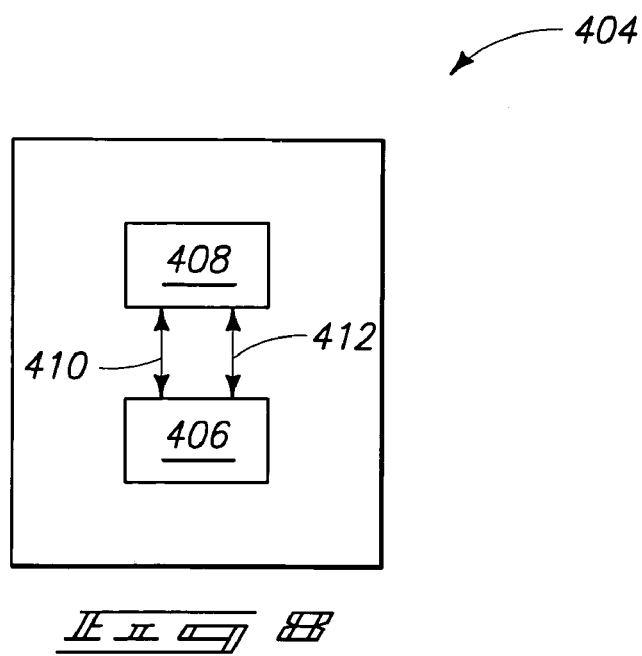
FIG. 8 is a block diagram showing particular features of the motherboard of the FIG. 7 computer.

FIG. 7 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. The microprocessor and/or memory device can comprise various aspects of the invention described above.

Memory device 408 can comprise an array of memory cells, and such array can be coupled with addressing circuitry for accessing individual memory cells in the array.

Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 8. In such block diagram, the addressing circuitry is illustrated as 410 and the read circuitry is illustrated as 412.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 9 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include layers and constructions in accordance with various aspects of the present invention.

FIG. 10 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided. At least one of the various circuits and devices of system 800 can include one or more constructions and/or layers formed in accordance with aspects of the invention described above with reference to FIGS. 2-6.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications integrated circuitry can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a layer, comprising:
   providing a material having at least one opening extending therein;
   exposing a surface of the material to one or more of titanium oxide, neodymium oxide, yttrium oxide, zirconium oxide and vanadium oxide to activate said surface, the activated surface extending into the opening;
   exposing the activated surface to a component to form a layer containing the component and extending conformally along the activated surface and into the opening; and
   wherein the component is aluminum, and the exposure of the activated surface to the component comprises exposure of the activated surface to an aluminum-containing compound and one or both of silazane and silane.

2. A method of forming a layer, comprising:
providing a material having at least one opening extending therein;
exposing a surface of the material to one or more of titanium oxide, neodymium oxide, yttrium oxide, zirconium oxide and vanadium oxide to activate said surface, the activated surface extending into the opening;
exposing the activated surface to a component to form a layer containing the component and extending conformally along the activated surface and into the opening; and
wherein:
the material is an electrically insulative material supported by a semiconductor wafer; and
the exposing of the surface of the material to one or more of titanium oxide, neodymium oxide, yttrium oxide, zirconium oxide and vanadium oxide comprises immersion of the wafer and insulative material supported thereby in a liquid comprising one or more of titanium oxide, neodymium oxide, yttrium oxide, zirconium oxide and vanadium oxide.

3. The method of claim 2 wherein the component is selected from the group consisting of aluminum, copper, gallium, germanium, ruthenium and silicon.

4. A method of forming an aluminum-containing layer, comprising:
providing a semiconductor substrate having an insulative material thereover; the insulative material having an undulating outer surface that extends into one or more openings;
treating the undulating surface of the insulative material with one or more oxides selected from the group consisting of titanium oxide, neodymium oxide, yttrium oxide, zirconium oxide and vanadium oxide; and
exposing the treated surface to an aluminum-containing compound and one or both of silane and silazane to form an aluminum-containing layer that extends conformally along the treated undulating surface.

5. The method of claim 4 further comprising annealing the aluminum-containing layer at a temperature that progresses from a first temperature of from about 140° C. to about 160° C. to a second temperature of from about 230° C. to about 260° C.; with said anneal being conducted for a time of from about 10 minutes to about 30 minutes.

6. The method of claim 4 wherein the exposing is conducted at a temperature of from about 100° C. to about 200° C.

7. The method of claim 4 further comprising forming two or more integrated circuit structures supported by the semiconductor substrate, and incorporating the aluminum-containing layer into electromagnetic interference shielding between at least two of the integrated circuit structures.

* * * * *